United States Patent [19]
Swager

[11] 3,933,220
[45] Jan. 20, 1976

[54] CLIMBING DEVICE

[76] Inventor: William E. Swager, P.O. Box 498, Fremont, Ind. 46737

[22] Filed: May 17, 1974

[21] Appl. No.: 471,061

[52] U.S. Cl. ............................................... 182/3
[51] Int. Cl.² ....................................... A62B 35/00
[58] Field of Search ........ 182/3, 4, 8; 248/246, 244; 24/265 CD, 201 A; 294/5.5, 85

[56] References Cited
UNITED STATES PATENTS

| | | | |
|---|---|---|---|
| 1,916,208 | 7/1933 | Diou | 182/8 |
| 2,703,692 | 3/1955 | Felix | 248/244 |
| 3,200,904 | 8/1965 | Weeks | 182/3 |
| 3,348,632 | 10/1967 | Swager | 182/230 |

FOREIGN PATENTS OR APPLICATIONS 1,961,757  12/1969  Germany ............................. 182/8

*Primary Examiner*—Reinaldo P. Machado
*Attorney, Agent, or Firm*—S. B. Wiczer

[57] ABSTRACT

A safety clamping device for use by climbers mounted in an elongated slot in a support rail, alternately to slide or grip the sides of the slot in clamping engagement. The clamping means preferably comprises opposed spaced apart wedges carried by a trigger arm above and below the slot in normal sliding movement with the climber, the wedges being actuated into clamping engagement, with the walls of the slot by quick angular pull of the trigger arm by the climber.

19 Claims, 19 Drawing Figures

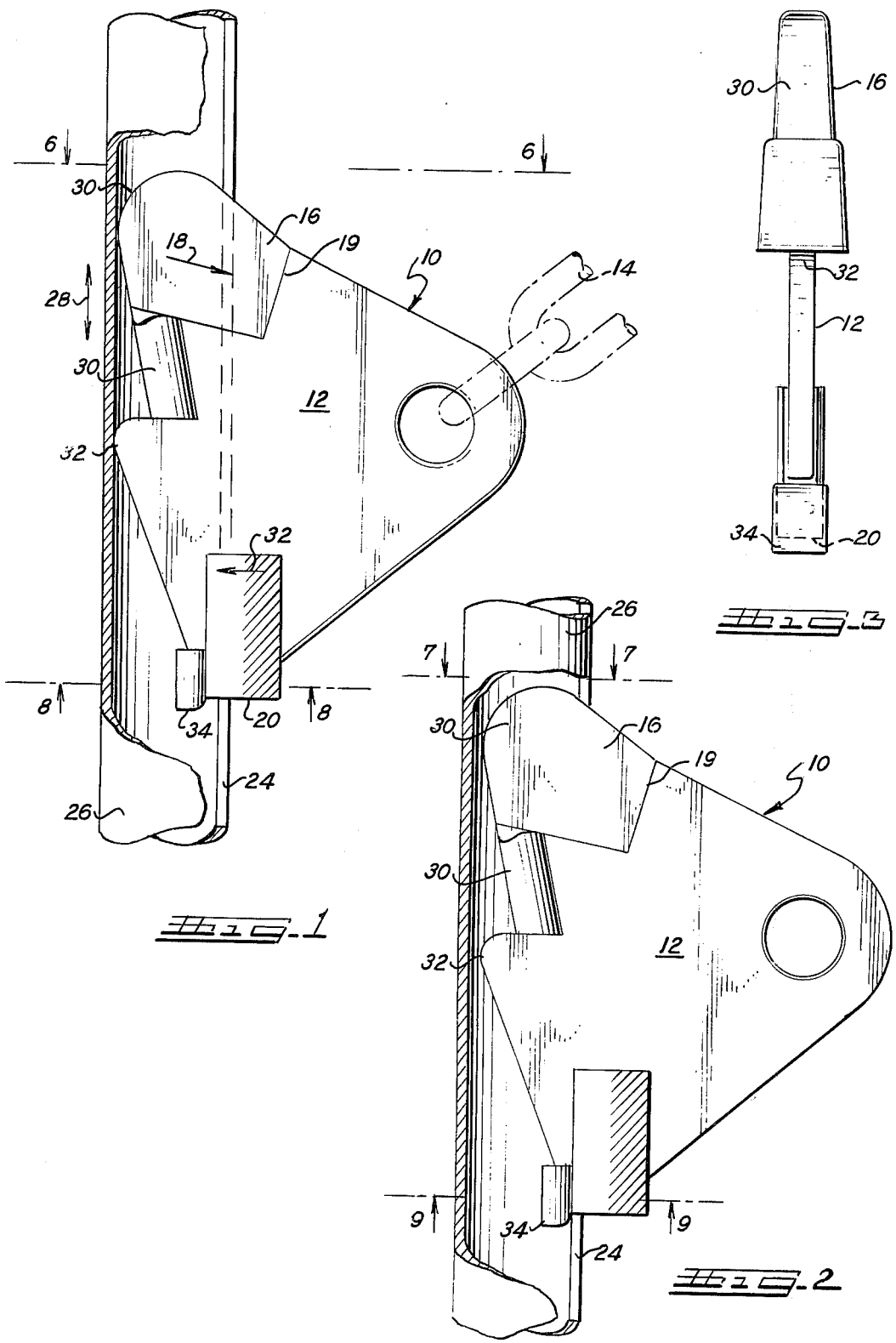

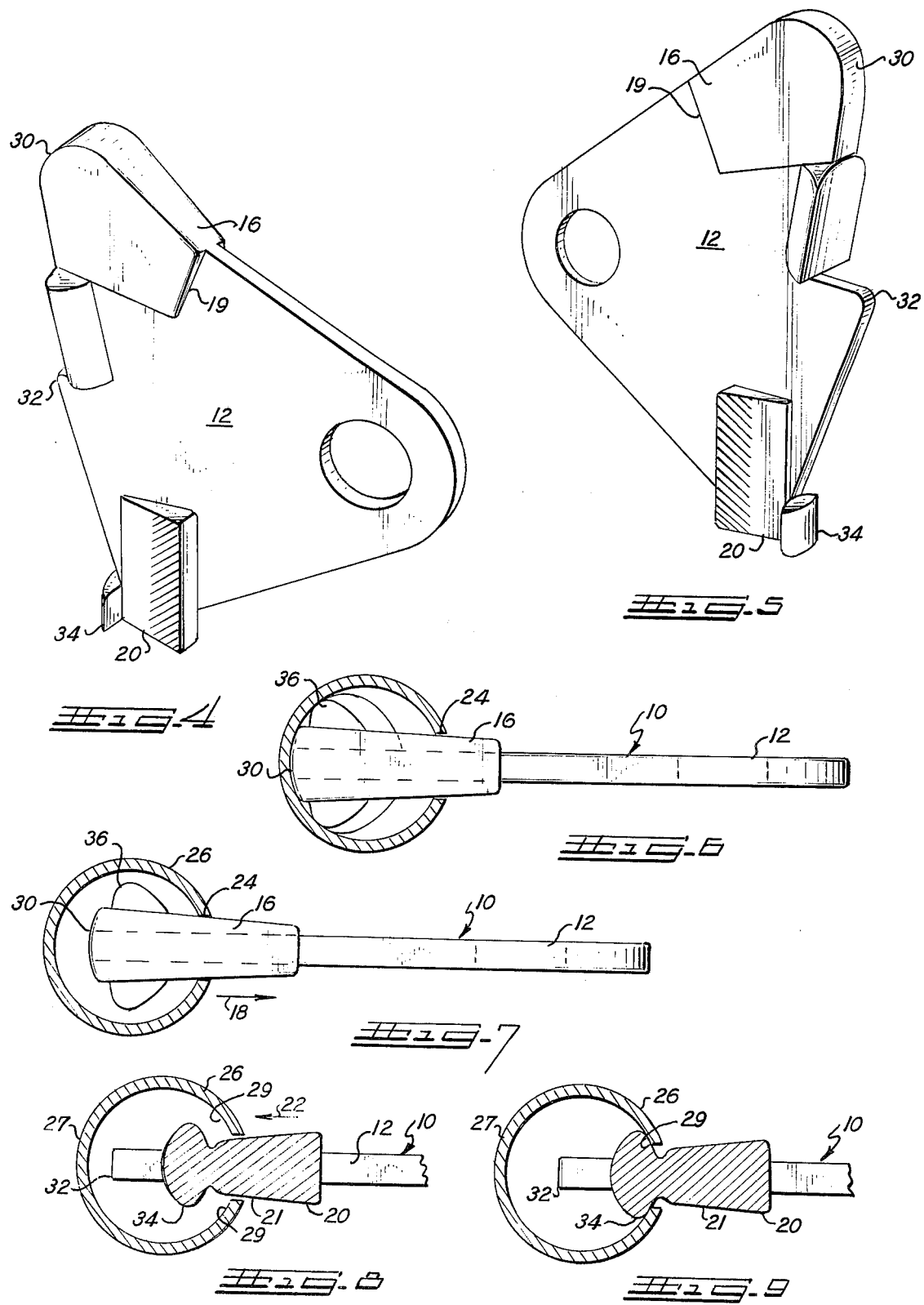

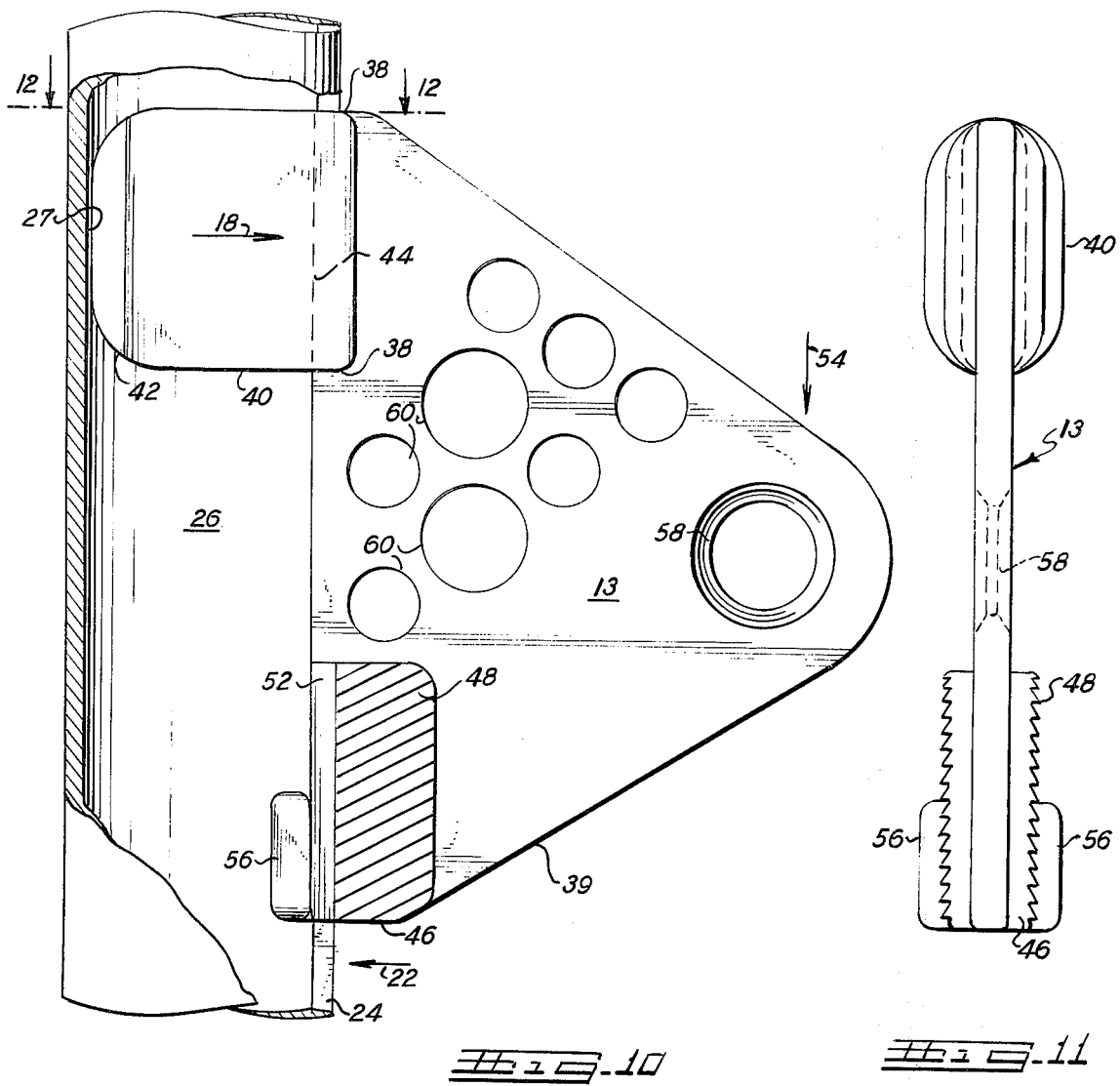
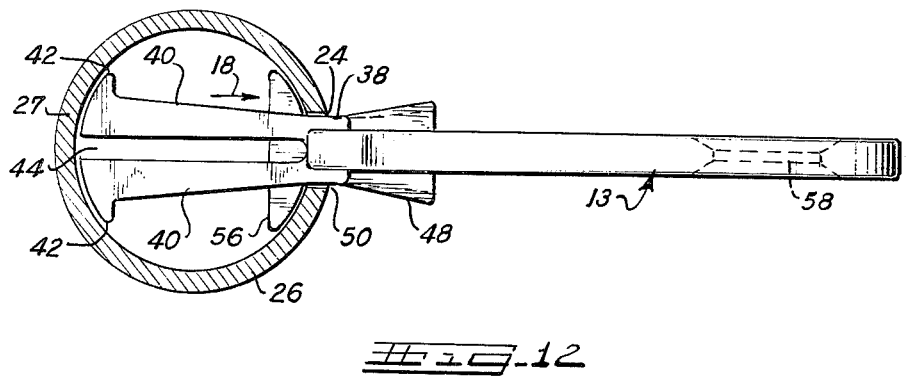

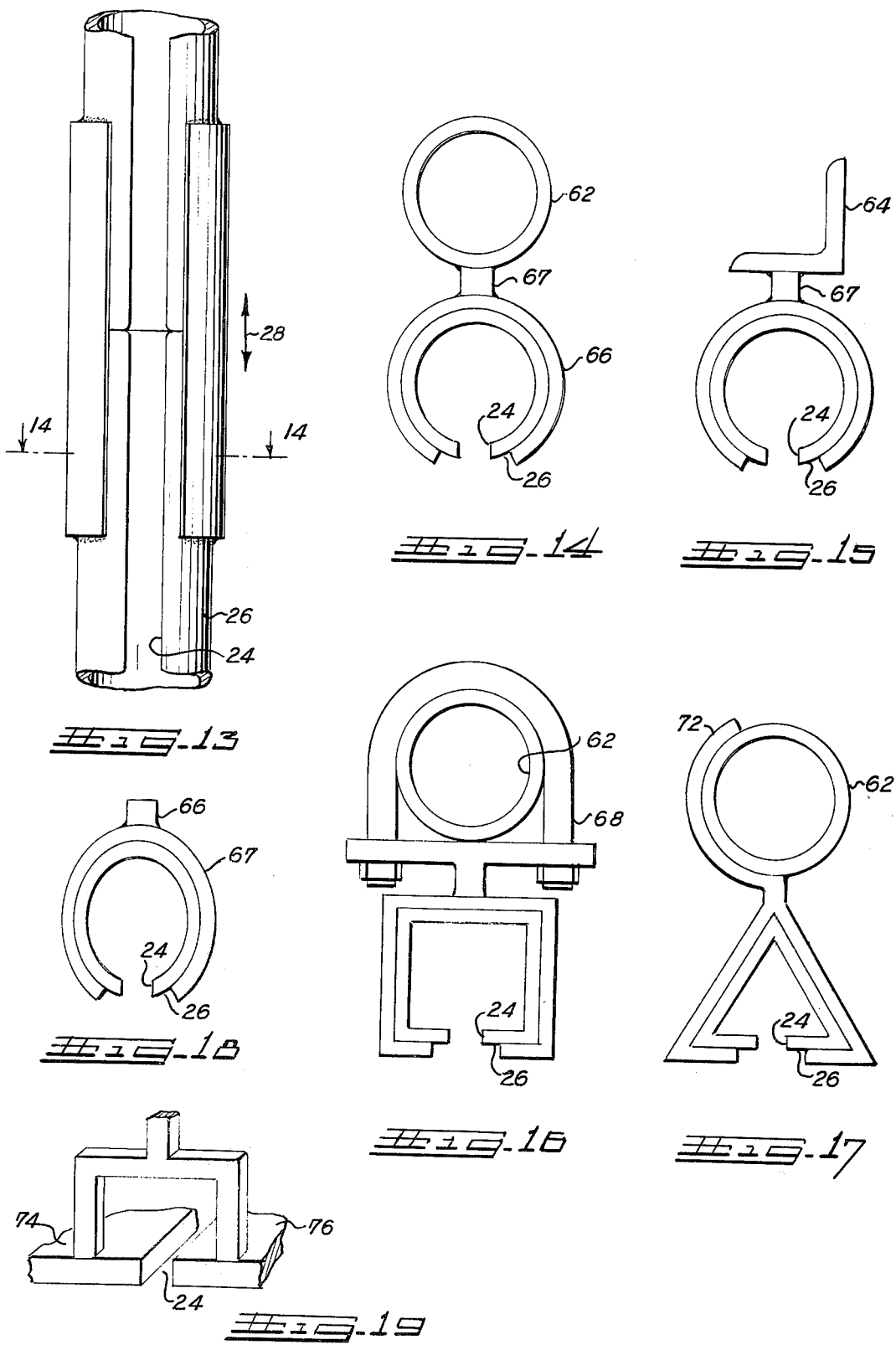

CLIMBING DEVICE

This invention relates to a climber's safety device, and comprises a clamping means actuated by a chain or rope usually fastened to a safety belt mounted about a climber or a worker at great height, the clamping means being freely longitudinally slideable in a fixed support such as in a groove of a supporting rail fixed for support to a ladder, staircase, scaffolding or the like, for easy sliding or clamping engagement as the climber ascends or descends in safety. The clamping means is adapted to grip and lock by wedging firmly to the supporting rail when triggered into clamping engagement therewith by a fast movement, such as a falling movement of the climber.

More particularly, the safety device hereof is adapted to slide in an elongated groove or slot cut in an accessible position of a wall of a fixed, preferably hollow longitudinally extending bracing rail, and has clamping means carried and triggered by a portion which extends outward of the slot in the supporting rail. A chain or rope is fastened to the body of the climber and the trigger arm of the device, both for easy sliding movement with the climber and for being actuated to grip the edges of the slot or groove of the rail firmly securing the clamping means thereto when triggered into clamping engagement.

As shown in my prior U.S. Pat. No. 3,348,632, a climbing safety device is shown adapted to ride upon the smooth surface and grip both edges of a flange of a I-beam type as a clamp and supporting structure.

The clamping means of the present invention is adapted to be mounted to slide within a slot or groove having parallel mating sides against which the present clamping device wedges to form a safety grip therewith, or on release is guided within the hollow rail to slide easily in the longitudinal groove with the climber. In preferred construction, the clamping device is insertable, a portion to slide within an annular or hollow supporting rail, such as tubular body having a slot or groove cut in one of the walls and extending longitudinally of said rail. The clamping means hereof carries wedging means to grip the edges of the groove when triggered by a quick movement of the climber angular to the axis of said rail for clamping engagement therewith. When so triggered, the clamping means will firmly engage the edges of the groove and prevent movement, thereby safely securing the climber to the rail through a flexible band, rope or chain having one end connected to actuate the clamp and its other end connected to the climber. A moderate quick pull on the trigger arm of the clamp will initiate gripping of said clamp to the edges of the groove. The same connecting chain or rope when moved in an opposite longitudinal direction along said groove will disengage the wedges from the groove edges and from clamping engagement with the support rail, and draw the clamp, sliding in the rail, upward or downward with the climber. Thus, the clamping means mounted to slide easily in the groove of the rail operates as a safety device allowing safe easy sliding climbing movement as the climber ascends or descends a staircase, ladder means, scaffolding or the like, to which the fixed rail providing sliding support is securely fastened.

The fixed support, according to the preferred structure shown, engages the clamp through the sides of a groove and thus is preferably a hollow body such as a pipe with a groove or slot cut in its most easily accessible upper side running parallel to its axis. It can be any elongated body of any cross-sectional configuration having a groove in which the clamping means may slide to engage the grooved wall. Hence, that support rail can be rectangular, triangular, ovate, circular or the like.

The clamp structure combined with a supporting rail having a longitudinal groove, also includes a triggering arm extending from the longitudinal groove, and may also carry guide means which bears slideably against one or more wall portions of the rail. The triggering arm also supports the clamping, preferably wedging means gripping opposite sides of the longitudinal groove. Such means are brought into the wedging engagement with said groove by a pivotal movement of the triggering arm applied angular to the plane of the groove most usually effected when pulled rapidly downward by the climber. For this purpose, the triggering arm is secured to a rope or chain having its opposite end carried by the climber. Thus, in normal climbing or descending movement, the climbing device is guided to slide in the groove smoothly up and down the support rail, but wedges to clamp tightly against edges of the groove by a quick angular pulling movement downward on the extending trigger arm, such as by a quick descending pull of the climber.

The invention is described further in alternate modifications, in both of which a pair of upper and lower wedges have angular wedge surfaces which engage the edges of the groove of said rail, and in an alternate modified form, one of the wedges is a partially split body, U-shaped to have some built-in flexibility, thereby to allow resilient compression of the body of the wedge in the groove, thereby clamping it with some resilience.

The invention is further described by reference to the drawings wherein:

FIG. 1 shows one form of the clamping device as mounted in a tubular support rail and having a portion of the wall broken away and in section to show internal construction;

FIG. 2 illustrates an alternate position of FIG. 1 with clamping wedges engaging edges of the groove;

FIG. 3 is a top plan view of the clamping means of FIG. 1 taken on the line 3—3 of FIG. 1;

FIG. 4 is an upper angular perspective view of a slideable clamping means;

FIG. 5 is a lower angular view of the slideable clamping means as shown in FIG. 4;

FIG. 6 is a horizontal section taken on the line 6—6 of FIG. 1;

FIG. 7 is a horizontal section taken on the line 7—7 of FIG. 2;

FIG. 8 is a horizontal section looking upward taken on the line 8—8 of FIG. 1;

FIG. 9 is a horizontal section looking upward taken on the line 9—9 of FIG. 2;

FIG. 10 is a second modification of a form of the clamping device mounted in a tubular support rail having part of the wall broken away and in section to show internal construction;

FIG. 11 is a side view of the clamping means of FIG. 10;

FIG. 12 is a horizontal section taken on the line 12—12 of FIG. 10;

FIG. 13 is a portion of the tubular support showing the open groove and secondary rail means for supporting the rail;

FIG. 14 is a section taken on the line 14—14 of FIG. 13;

FIG. 15 shows an angle iron support for the rail;

FIG. 16 shows both an alternate clamping means as a secondary support and a square configuration of the hollow support;

FIG. 17 shows an alternate support for the rail and a triangular shaped hollow rail;

FIG. 18 shows an ovate shaped grooved rail; and

FIG. 19 shows a pair of plates separated to form a groove and support by a secondary means.

As shown in FIGS. 1 and 2, the safety device comprises a clamping means 10 comprising a plate-like trigger arm 12 attached to be fastened by way of a chain 14 or a rope (not shown) attaching to the plate at an extended off balance point. The outer end of the chain extends a selected distance for fastening usually to a belt mounted about the body such as the waist of the climber (not shown). The trigger arm plate 12 is of substantial thickness sufficient to be rugged and substantially inflexible and provides the base or body of the clamping means 10. An upper wedge 16 is mounted on the plate 12 having its sides slanting downward to the plate surface in the direction of the arrow 18 to meet the outer surface of the plate 12 at 19. The lower wedge 20 has its sides slanting oppositely downward to the surface of the plate 12 in the direction of the inner plate end as shown by the arrow 22. Thus, the wedges 16 and 20, each slant in opposite directions. The wedges are separated several inches, of non-critical distance, but are so disposed with respect to each other that the central slanting surface portion of each wedge are about vertically aligned with respect to the plane of a grooved or a slotted portion 24 of an elongated supporting body, such as a rail 26.

In this position of the wedges with respect to each other, the plate 12 and wedges thereon are sized, together with the groove or slot 24, to slide smoothly in the groove 24 longitudinally upward or downward in the direction of support 26 as shown by the arrow 28. Such groove or slot 24 longitudinally cut in a pipe 26 is best shown in FIG. 12. Since the wedges are inverted with respect to each other,, each slanting in a direction opposite to the other, both are aligned in vertical direction of the arrow 28 and are dimensioned to slide vertically up and down the groove 24 smoothly. Any movement of the lower wedge inward of the groove 24 in the direction of the arrow 22 will cause the upper wedge 16 to move oppositely in the direction of arrow 18, both wedges thus tending to bind as they move angularly into the groove as wedges, and consequently a pull downward by the rope or chain 14 rapidly or in a direction other than vertical will cause plate 12 to move angularly with respect to the axis of slot 24 as shown by arrow 21. It is that angular movement of the plate 12, lower wedge 20 moving in a direction of the arrow 22, and the upper wedge 16 in a direction of the arrow 18 will cause both wedges to to grip the edges of slot 24, binding the clamp firmly thereby against the slot edges, and prevent vertical movement.

In rising with gentle upward pull, the wedges will release their frictional grip and slide easily vertically with the climber. Similarly, with no angular force applied downward on the plate 12, the wedges will not bind or engage the edges of the groove 24 and the clamping plate 12 will also descend in a sliding movement of the plate 12 in the groove 24 in easy descent of the climber. Rapid angular movement downward will effect the firm clamping.

For purposes of guiding plate 12, the forward end of wedge 16 is rounded at 30. As the wedge 20 is held outward of the groove 24, in upward pull on chain 14 by the climber, the rounded nose 30 moves inward of the tubular body 26 and opposite to the direction of the arrow 18 to engage the inner wall of the tubular support 26 and guides the plate 12 in smooth sliding ascending motion as the nose 30 bears as a guide against the inner wall 27 of the tubular support 26. A second portion 32, centrally of the plate 12, extends downward toward the inner pipe wall 27, and has a rounded nose 32. It also operates as a central guide bearing together with the upper guide 30 against the inner wall 27 of support 26. Thus, both guides 30 and 32 can smoothly bear against the wall 27 and guide the clamping plate 12 in upward movement with one or both rounded ends bearing against the inner wall 27 of the hollow support 26 for easy sliding movement of the device with the climber. In that sliding movement as shown in FIG. 1 with the chain 14 pulling upward as the climber ascends, both wedges 16 and 20 slide vertically smoothly on opposite sides, and with their lower wedge portions in the groove 24. In the descending movement, as shown in FIG. 2, both guides 30 and 32 move away from contact with the inner wall 27.

A lower guide 34 is disposed below wedge 20 and has laterally flaring sides so that when the plate 12 is pulled upward and the lower wedge 20 moves opposite to the arrow 22 tending to leave the groove 24, the flaring sides of the guide 34 engages the underside of the support 26, as shown in FIG. 8, and bears against both underside 29 of the walls adjoining the groove 24.

Thus, the guide 34 keeps the lower wedge and clamping means retained within the groove 24 and forms an inner guide for the clamp plate for easy sliding movement on the support 26 as it bears against both sides of the groove 24.

An additional pair of guides 36 are mounted beside and vertically below the upper wedge 16 and flare widely laterally. These guides 36 serve to bear against side walls when the clamp 12 is used with a hollow support 26 having combining walls dimensioned more clearly to the size of clamping means. For larger tubular support rails, as well as other shapes of support rails as would appear, these several guide elements serve to provide optimum smooth guiding movement to the clamping means in ascending and descending passage through the groove 24, sized to fit the hollow support structure with which the clamp will be used, but primarily for a use with a circular rail support some or all of the guides may be omitted, and the clamping device, while it will not move and operate as smoothly within the rail support of the various shapes, it will still operate merely by the clamping effect of the opposed wedges in the groove 24, mounted upon a trigger arm 12.

A modified form of clamping means is shown in FIGS. 10, 11 and 12. In this construction, as shown in FIG. 10, a forward wedge 38 continues into a guide means comprising a pair of legs 40 whose lower ends 42 are rounded to form a guide means extending for engaging the inner side 27 of the tubular support 26. It supplies a smooth sliding movement to the clamp. Such guide legs 40 are separated by a long inner slot 44 which extends substantially across the diameter of the support tube 26 and provides a resiliency to both legs 40. The upper portion of the legs terminate in a yoke shaped as the wedge 16, whereby upon wedging movement in the slot 24, in the direction of the arrow 18, the legs 40 grip the slot sides 24 resiliently as accommodated by the slotted portion 44, providing a more resilient gripping of the upper wedge 16 in the slot 24.

The lower wedge 46 has serrations or teeth 48 cut angularly in its slanted sides, which tend to impart a bite and more firm gripping of the sides of slot 24. As shown in FIG. 10, the slanted walls of the wedge 46, when placed for easy sliding moving position in the groove 24, has the slanted walls thereof terminated at the opposite side position 50 of a support 26, the wedge wall 48 continuing as parallel walls 52 in the same place as the trigger plate 13 whereby the lower portion 52 fits to slide smoothly within and with sides parallel to the groove walls 24. Thus, moving angularly in the direction of the arrow 22, the wedge wall 48 moves into the groove 24 gripping its sides in firm clamping engagement as triggered by a downward pull on the trigger plate 13 by the climber. A lower guide means 56 mounted beneath the lower wedge 46 has laterally flaring sides and is shaped to guide the lower wedge 46 as the guide 56 bears against the inner wall 29 of the support 36 when the plate 13 moves in the direction of the arrow 54. As shown in FIG. 10-12, the trigger arm 13 is bored with a hole 58 to receive the actuating chain 14.

The plates and guides of the entire clamping device may have its weight considerably reduced by changing the body of the plate 13 itself to a foraminous structure such as porous or expanded metal (not shown); or the weight of the plate may be reduced easily by cutting holes 60 therein at several places as shown, as many as may be practical without actual impairing the strength or flexibility of the plate significantly.

As shown in FIG. 13-19, the support rail 26 may be tubular, having a slot 24 and the guides mounted on the trigger plate are placed to accomodate the inner shape of the rail. Its intended that the tube 26 be mounted for rapport merely as a support similar to a hand rail having an open slot 24 running longitudinally thereof, and it may have terminal open positions so that the clamping device may be inserted for claiming consideration into an open end of the rail (not shown). The tube 26 itself may be supported forward from or above a secondary support, such as a usual hand rail 62 (as shown in FIG. 14); or an angle iron support 64. A clamping sleeve 66, extends from the rail 62 by way of bracket 67 for a support of the tube 26. However, it may be otherwise supported, for example, as shown in FIG. 16, in which rail 26 may be a rectangular, similarily having an open slot 24 supported by an encircling bracket 68, in turn bolted to a secondary support 62 as shown. In alternate construction as shown in FIG. 17, the supporting rail may have triangular sides supporting an open slot 24 engagedment of the clamping means hereof. Again, the rail may be oval shaped as in FIG. 18 and similarly support to bracket 67 to a secondary support. Such rail shapes as shown in FIGS. 16, 17 and 18 may be supported by a secondary support 62, such as by welding a circular bracket thereto.

While each of these figures show a hollow rail they really may be merely two plates 74 and 76 supported by bracket areas in a manner to form a continuous longitudinally groove 24 therebetween.

It will be apparent in each of these modified constructions other than the circular tube, the guide means 30, 32, 34, 36, 42 and 56 may either be omitted or so placed as to accommodate the particular shape of the support structure for easy sliding movement at the clamping in a manner to prevent its withdrawal from its sliding clamping position within the groove 24 in its normal clamping use as described.

As thus described, an improved clamping means is provided which not only slides in a groove or slot 24 of a supporting rail so that it is easily carried by a climber in ascending or descending movement, as well as other safety uses such as by a climber or worker on high scaffolding, but the structure of the clamping means is both novel and uniquely adapted to operate by clamping into a groove or slotted support. Such clamping means, it will be recognized, is outstanding because it is activated by any sudden jerk or spasmodic movement by the user as a safety support either against taking a misstep or falling, such movement operating to supply a quick force to the clamp in any direction other than the normal ascending and descending casual movement of the climber. Thus, the unit operates quite effectively for the purpose of providing great safety to the user with little hinderance to his movements, and only the reaction of the user to normal danger becomes generally the very movement required to actuate the clamp.

Moreover, it will be recognized the present clamp has improved facility for use by clamping upon the walls of any groove or slot designed to receive the clamping means in sliding movement therein. This is greatly improved over prior art structures which generally require a more complicated clamping means, and which generally operate exteriorly, of a supporting rail. In this respect, any hollow grooved rail or even two plates which provide between them a firmly supported slot will provide here safety support for the climber. Moreover, applicant's wedging structure is outstandingly improved. As a clamping means easily slideable in a slot or groove, bringing wedges into operative gripping engagement with the walls of such slot by angular movement of a trigger arm support. That clamping structure is very effective as well as being quite rugged and dependable. The preferred hollow or round pipe support is most economical and most easily fastened a secondary firm support as described.

Certain modifications will occur to those skilled in the art and is intended that the description given herein be regarded as exemplary and not limiting except as defined in the claims.

I claim:

1. A safety device comprising the combination of a clamping means and an elongated firm support rail, an elongated slot disposed in the outer surface of said support rail, said slot having substantially parallel facing walls on each side, said clamping means having a clamping portion mounted alternately to slide freely in said slot in sliding engagement with said side walls and including means for gripping and binding said clamping means firmly to said facing walls of said slot to prevent movement in the position of clamped engagement with said support rail, and a trigger arm supporting said clamping means extending laterally from said clamping means for moving said clamping means in easy pull sliding in said slot, and for activating said clamping means into clamped engagement with the facing walls of said slot by rapid downward pull by the user.

2. The safety device as defined in claim 1 wherein the rail is an elongated hollow body having a slot cut in one of the walls longitudinally thereof and the clamping means carries guide means disposed to slide against an inner surface of said hollow body.

3. The safety device as defined in claim 1 wherein the rail is a pipe having a slot cut longitudinally thereof in one of the walls and the pipe is fastened to a firmly secured secondary support.

4. The safety device as defined in claim 1 wherein the rail is an elongated rectangular shaped hollow body having a slot cut longitudinally thereof in one of the walls and the hollow body is fastened to a firmly secured secondary support.

5. The safety device as defined in claim 1 wherein the rail is an elongated triangular shaped hollow body having a slot cut longitudinally thereof in one of the walls and the hollow body is fastened to a firmly secured secondary support.

6. The safety device as defined in claim 1 wherein the rail is an elongated ovular shaped hollow body having a slot cut longitudinally thereof in one of the walls and the hollow body is fastened to a firmly secured secondary support.

7. The safety device as defined in claim 1 wherein edges separated plates are supported together to form the slot between them, said plates being fastened and supported to a firmly secured secondary support.

8. A safety device as defined in claim 1 wherein the clamping device carries a pair of opposed wedges, mounted upon a supporting surface, separated a short distance from each other, the slanted walls of said wedges tend to bind said device against the walls of the slot frictionally in an angularly downward movement of said supporting surface of the clamping device with respect to the axis of said slot.

9. A safety device as defined in claim 8, wherein the wedges are supported upon a plate-like member forming said supporting surface and having its surface sized to slidily fit in said slot for easy longitudinally movement of said clamping means in said slot, said opposed wedges being mounted on said plate above and below the axis of said slot with a portion of said plate-like support extending laterally outward of said slot, said wedges tending to bind and grip the walls of said slot by application of force angularly downward to the axis of said slot upon said laterally extending plate portion.

10. The safety device as defined in claim 8 wherein said supporting surface extends slidingly through said slot for easy sliding movement longitudinally thereof and carries said opposed wedges, one disposed above and the other below the longitudinal axis of said slot, and guide means disposed on the inner support below said wedges in said slot and bearing against the inner walls of said rail for guiding the sliding movement of said clamping means in said slot.

11. The device as defined in claim 10 wherein said rail is a hollow body having a slot cut longitudinally through the walls thereof and guide means being supported from said support surface to bear both against the inner wall of said hollow body as well as the inner wall portions adjacent to said slot.

12. The device as defined in claim 8 wherein one of the wedges is centrally split to provide wedging resilience to said wedge bearing against the walls of said slot in clamping engagement therewith.

13. The safety device as defined in claim 12 wherein said split wedge extends diametrically within said hollow body sufficient to engage the inner wall thereof, and form a guide for sliding movement of said clamping means in said slot.

14. The device as defined in claim 10 wherein one of said guide means is disposed below the uppermost wedge and flares laterally to slide against the inner wall surfaces adjacent to said slot.

15. A safety device having a hollow annular rail, an elongated slot cut in the hollow wall and disposed to run parallel to the axis of said rail and clamping means comprising a trigger arm having its inner end dimensioned to fit slidingly in said slot and having its outer end extending laterally of said slot including means for attaching a chain, rope or the like for movement by a climber in use of the clamping means, pulling said trigger arm slidingly in said slot as he ascends and descends, said trigger arm carrying a pair of opposed wedges one disposed above and the other below said slot in easy sliding movement longitudinally thereof as pulled by said climber; said opposed wedges tending to bind and grip the walls of said slot when said trigger arm is pulled rapidly and angularly downward to the axis of said slot.

16. The safety device as defined in claim 15 further having guide means disposed beneath said wedges within said hollow rail and shaped to bear against the inner walls thereof guiding said clamping means for easy sliding movement in said rail.

17. The safety device as defined in claim 16 wherein at least two guide means are mounted on the inner rail support portion of said trigger arm, and shaped to bear against the inner walls of said rail, a forward guide means disposed beneath the upper wedge in ascending direction, and a lower guide means in said direction disposed beneath the lower wedge and shaped to bear against the inner wall surface within said hollow rail adjacent to the sides of said slot for guiding the lower end thereof.

18. A safety device including a clamp having an operating arm sized to fit slidingly in an elongated slot and to grip firmly supported walls on each side thereof by angularly downward movement of said arm and sliding freely in vertical raising and lowering movement of clamp in said slot said clamp comprising a pair of opposed wedges mounted upon a support surface of said arm and separated a short distance from each other and disposed on said supporting surface to slide freely therewith, one above and the other below the axis of said slot, said wedges tend to bind and grip the walls of said slot when the said arm is pulled rapidly and angularly downward to the axis of said slot.

19. The safety device as defined in claim 1 wherein the clamping means has a serrated surface actuated by said clamping means into gripping and binding engagement of the clamping means against the faces of the walls on both sides of said slot.

* * * * *